United States Patent
Hattori

(10) Patent No.: US 7,483,455 B2
(45) Date of Patent: Jan. 27, 2009

(54) CONTROL METHOD AND CONTROL CIRCUIT FOR LASER DIODE, AND OPTICAL TRANSMITTER USING THE SAME

(75) Inventor: Keita Hattori, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 321 days.

(21) Appl. No.: 11/042,329

(22) Filed: Jan. 26, 2005

(65) Prior Publication Data

US 2005/0286575 A1   Dec. 29, 2005

(30) Foreign Application Priority Data

Jun. 28, 2004   (JP)   ............... 2004-190371

(51) Int. Cl.
*H01S 3/13* (2006.01)
*H01S 3/00* (2006.01)
(52) U.S. Cl. .................. 372/29.02; 372/29.011; 372/29.014; 372/29.015; 372/31; 372/38.07
(58) Field of Classification Search ............. None
See application file for complete search history.

(56) References Cited

U.S. PATENT DOCUMENTS

| | | | | |
|---|---|---|---|---|
| 4,592,057 A | * | 5/1986 | Comerford | 372/38.07 |
| 5,311,005 A | * | 5/1994 | Visocchi | 250/205 |
| 5,812,572 A | * | 9/1998 | King et al. | 372/38.04 |
| 6,055,252 A | * | 4/2000 | Zhang | 372/34 |
| 6,414,974 B1 | * | 7/2002 | Russell et al. | 372/29.015 |
| 6,661,817 B1 | * | 12/2003 | Ames et al. | 372/29.021 |
| 6,711,189 B1 | * | 3/2004 | Gilliland et al. | 372/38.02 |
| 6,845,118 B1 | * | 1/2005 | Scott | 372/96 |
| 2002/0021641 A1 | * | 2/2002 | Miyabeta et al. | 369/53.26 |
| 2005/0078721 A1 | * | 4/2005 | Wu et al. | 372/38.01 |

FOREIGN PATENT DOCUMENTS

| | | |
|---|---|---|
| JP | 2001-352125 | 12/2001 |
| JP | 2002-111120 | 4/2002 |
| JP | 2003-169022 | 6/2003 |

* cited by examiner

*Primary Examiner*—Minsun Harvey
*Assistant Examiner*—Sean Hagan
(74) *Attorney, Agent, or Firm*—McGinn.IP.Law Group, PLLC

(57) ABSTRACT

A control method for a laser diode is conducted such that optical output and OMA (optical modulation amplitude) or extinction ratio of the laser diode are controlled while modulating the optical output of the laser diode by applying a bias current and a modulation current to the laser diode. The method has: a first step of measuring the optical output of the laser diode; a second step of measuring a slope efficiency or a corresponding value of the slope efficiency while conducting APC (automatic power control) to adjust the bias current such that the optical output coincides with a predetermined value; and a third step of adjusting the modulation current by AAC (automatic amplitude control) according to the slope efficiency or the corresponding value of the slope efficiency such that the OMA or extinction ratio coincides with a predetermined value.

18 Claims, 7 Drawing Sheets

CONTROL METHOD AND CONTROL CIRCUIT FOR LASER DIODE, AND OPTICAL TRANSMITTER USING THE SAME

The present application is based on Japanese patent application No.2004-190371, the entire contents of which are incorporated herein by reference.

BACKGROUND OF THE INVENTION

1. Field of the Invention

This invention relates to a control method and a control circuit for a laser diode (LD) and, particularly, to a control method and a control circuit that can cope with a change in optical output intensity of LD due to a temperature change and an elapsed-time change, and further relates to an optical transmitter using the same.

2. Description of the Related Art

An optical transmitter used for optical communications is equipped with a light source to output light with an intensity according to a bias current and a modulation current, and a modulation circuit to generate the modulation current according to a transmission signal. A transmission signal (herein, a digital signal with a voltage corresponding to logical "1" or "0") sent from an external device is differentially amplified and buffer-amplified, and one or both of its differentially amplified signals are applied to a laser diode, and, thereby, an optical transmission signal can be obtained that its optical output intensity changes between "1" level and "0" level according to "1" and "0" of the transmission signal.

In optical transmitters, LD control is required such that OMA (optical modulation amplitude) and extinction ratio are increased as much as possible so as to obtain good identification sensitivity. The OMA and extinction ratio are values relating to the identification sensitivity of optical signal. The OMA is a difference between the "1" level and the "0" level of optical output, and the extinction ratio is a ratio of between the "1" level and the "0" level of optical output.

However, as the transmission rate of optical signal is increased, if the extinction ratio is too big, the oscillation of LD cannot follow, causing deterioration in waveform and an increase in jitter of the optical transmission signal. Further, in case of high-speed and long-distance transmission using an existing single mode fiber, if the extinction ratio is too big, a transitional change (chirp) is generated in the oscillation wavelength of LD. This causes deterioration in waveform after the long-distance transmission depending on a dispersion characteristic of optical fiber, and the identification sensitivity deteriorates by contrast. Therefore, in optical transmitters for high-speed or long-distance transmission, accurate control of extinction ratio is required.

On the other hand, LD has a property that its oscillation threshold current and slope efficiency change depending on temperature change and elapsed time change. Since the change of oscillation threshold current causes a change in optical output intensity and the change of slope efficiency causes a change in OMA and extinction ratio, control of bias current and modulation current is needed.

FIG. 1 shows a relationship between applied current and optical output intensity of LD. As shown in FIG. 1, when DC current (applied current I) exceeds an oscillation threshold Ith, the LD emits light. As the applied current I increases, the optical output intensity P increases linearly to the applied current I. The slope η (η=optical output intensity P/applied current I) of the linear section is called slope efficiency of LD. As shown in FIG. 1, when a bias current Ib and a modulation current Im are applied to LD, a modulated optical output can be obtained. The values of Ib and Im are set to obtain a predetermined optical output and OMA or extinction ratio.

FIG. 2 shows a temperature change and an elapsed-time change (relationship between the applied current and the optical output intensity) in LD. As shown in FIG. 2, the oscillation threshold Ith and slope efficiency η change depending on the temperature change and elapsed time change. In view of FIG. 2, it is understood that, when Ith is increased to Ith' and η is reduced to η' due to the temperature change or elapsed-time change, the predetermined optical output and OMA or extinction ratio cannot be obtained unless, according to such a change, the bias current Ibis increased to Ib' and the modulation current Im is increased to Im'.

In order to prevent the change of optical output intensity in LD, APC (automatic power control) is used that the bias current is subjected to a feedback while monitoring the optical output. Methods for preventing the change of OMA or extinction ratio are as follows.

(1) Surrounding temperature of LD is measured using a temperature sensor and its modulation current is controlled depending on the surrounding temperature (for example, Japanese patent application laid-open No.2002-111120, paragraphs [0030] to [0050]).

(2) OMA or extinction ratio is measured using a peak hold circuit etc. based on optical current of PD (photodiode) to monitor the optical output, and its modulation current is subjected to a feedback (for example, Japanese patent application laid-open No.2001-352125, paragraphs [0025] to [0038]).

(3) OMA or extinction ratio etc. is measured such that a RF signal with low frequency is superposed on bias current or modulation current and only the RF signal component is extracted from optical current of PD to monitor the optical output. Based upon this, its modulation current is subjected to a feedback (for example, Japanese patent application laid-open No.2003-169022, paragraphs [0018] to [0020]).

(4) Based on the variation of bias current and modulation current, a bias current or a modulation current is estimated that the OMA or extinction ratio can be kept constant. Based upon this, its modulation current is subjected to a feedforward. This method is based on a statistical prediction that the change of bias current and modulation current with the change of LD characteristic is generated in like manner whichever of temperature change or elapsed-time change causes that change. For example, the ratio of a variation in bias current and a variation in modulation current is controlled to be constant, and the ratio is set in manufacturing. Alternatively, data of bias current and modulation current are taken that the OMA or extinction ratio can be kept constant while changing the surrounding temperature in manufacturing, and it is controlled based on the data.

Method (1) can be most simply implemented and is in wide use. Method (2) can surely control the extinction ratio since it measures directly the extinction ratio. Method (3) allows the collection of a peak value of optical output since it uses the low frequency RF signal applicable to the response speed of PD.

However, the conventional LD control methods (1) to (4) each have problems as follows.

Method (1) cannot cope with an elapsed-time change of LD characteristic. Further, in method (1), since individual difference in temperature characteristic of LD is big, it is difficult to conduct the adjustment in manufacturing.

In method (2), when the transmission speed of signal increases such that it exceeds the response speed of PD to monitor the optical output, it becomes impossible to detect the peak value. Further, in method (2), it becomes difficult to downsize an optical transmitter equipped with such a LD control circuit since the external circuits are needed.

In method (3), since the test signal is additionally superposed on the transmission signal, there is a risk such as deterioration in optical waveform and an increase, oscillation etc. in jitter. Further, since the external circuits are needed, it is not suitable for a high-density package.

In method (4), the guarantee for elapsed-time change is obtain only within the statistical data. Further, due to dispersion in LD characteristic, adjustment in manufacturing needs a large load.

SUMMARY OF THE INVENTION

It is an object of the invention to provide a control method for laser diode that allows the easy adjustment in manufacturing, the prevention of deterioration in optical signal characteristic and the high-density packaging.

It is a further object of the invention to provide a control circuit for laser diode that allows the easy adjustment in manufacturing, the prevention of deterioration in optical signal characteristic and the high-density packaging.

It is a still further object of the invention to provide an optical transmitter using such a control method or a control circuit for laser diode.

According to first aspect of the invention, a control method for a laser diode, wherein optical output and OMA (optical modulation amplitude) or extinction ratio of the laser diode are controlled while modulating the optical output of the laser diode by applying a bias current and a modulation current to the laser diode, comprises:

a first step of measuring the optical output of the laser diode;

a second step of measuring a slope efficiency or a corresponding value of the slope efficiency while conducting APC (automatic power control) to adjust the bias current such that the optical output coincides with a predetermined value; and a third step of adjusting the modulation current by AAC (automatic amplitude control) according to the slope efficiency or the corresponding value of the slope efficiency such that the OMA or extinction ratio coincides with a predetermined value.

According to second aspect of the invention, a control circuit for a laser diode, wherein output of the laser diode is modulated by applying a bias current and a modulation current to the laser diode, comprises:

an APC (automatic power control) section that adjusts the bias current such that an optical output of the laser diode measured by a light receiving element coincides with a predetermined value;

a slope efficiency measurement section that measures a slope efficiency of the laser diode or a corresponding value of the slope efficiency; and an AAC (automatic amplitude control) section that adjusts, according to a measurement result of the slope efficiency measurement section, the modulation current such that OMA or extinction ratio of the laser diode coincides with a predetermined value.

According to third aspect of the invention, an optical transmitter comprises:

a laser diode;

a current source that applies a bias current to the laser diode;

a modulation circuit that applies a modulation current to the laser diode to modulate an output of the laser diode;

an optical output measurement circuit that measures an optical output of the laser diode; and a control section that conducts APC (automatic power control) to adjust the bias current such that the optical output coincides with a predetermined value, and AAC (automatic amplitude control) to adjust the modulation current, according to a slope efficiency or a corresponding value of the slope efficiency obtained in measurement, such that OMA or extinction ratio coincides with a predetermined value.

<Advantages of the Invention>

In the control method for laser diode of the invention, a bias current is adjusted by controlling the bias current of laser diode while feeding back a measurement result of optical output and a modulation current is adjusted based on slope efficiency or its corresponding value. Therefore, the method allows the easy adjustment in manufacturing, the prevention of deterioration in optical signal characteristic and the high-density packaging.

In the control circuit for laser diode or the optical transmitter of the invention, a bias current is adjusted by controlling the bias current of laser diode while feeding back a measurement result of optical output and a modulation current is adjusted based on slope efficiency or its corresponding value. Therefore, the control circuit and the optical transmitter allow the easy adjustment in manufacturing, the prevention of deterioration in optical signal characteristic and the high-density packaging.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment (Composition of Optical Transmitter)

Figure 3:
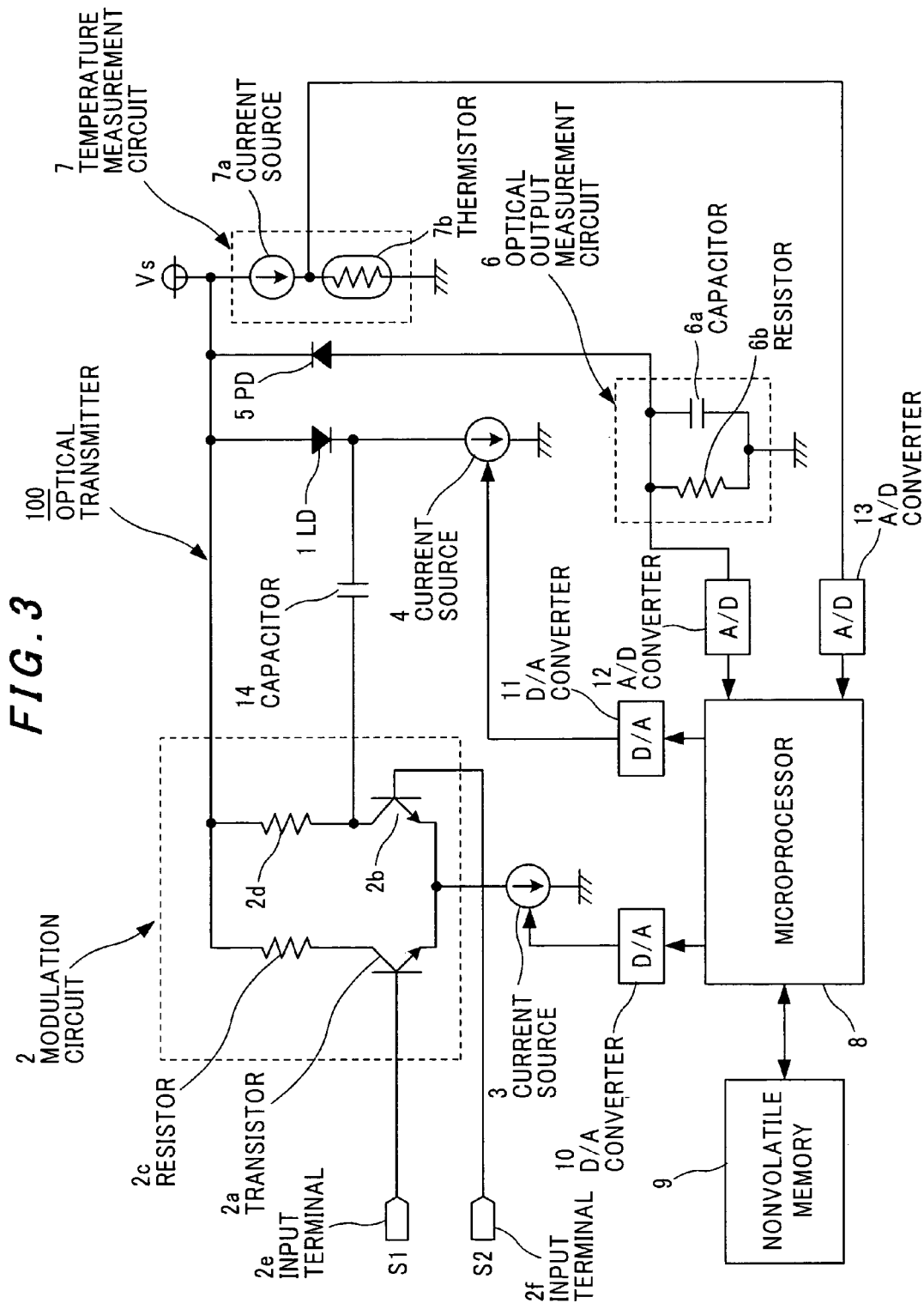
FIG. 3 is a circuit diagram showing an optical transmitter in a first preferred embodiment of the invention.

FIG. 3 is a circuit diagram showing an optical transmitter in the first preferred embodiment of the invention.

The optical transmitter 100 is composed of: LD (laser diode) 1 that emits to an optical waveguide etc. laser light with intensity according to a bias current and a modulation current; a modulation circuit 2 that generates a modulation current to be applied to the LD 1; a current source 3 that applies current to the modulation circuit 2; a current source 4 that applies bias current to the LD 1; a photodiode (PD) 5, light receiving element that is optically coupled to the backward output of LD 1 to monitor the optical output of LD 1; an optical output measurement circuit 6; a temperature measurement circuit 7 that measures a surrounding temperature; a microprocessor 8 as a controller with a program installed therein; a nonvolatile memory 9 that is connected to the microprocessor 8 and stores target values of optical output and OMA other than the program; a D/A converter 10 that is connected between the current source 3 and the microprocessor 8; a D/A converter 11 that is connected between the current source 4 and the microprocessor 8; an A/D converter 12 that is connected between the optical output measurement circuit 6 and the microprocessor 8; an A/D converter 13 that is connected between the temperature measurement circuit 7 and the microprocessor 8; a capacitor 14 that is connected between the collector of a transistor 2b and the LD 1.

Figure 1:
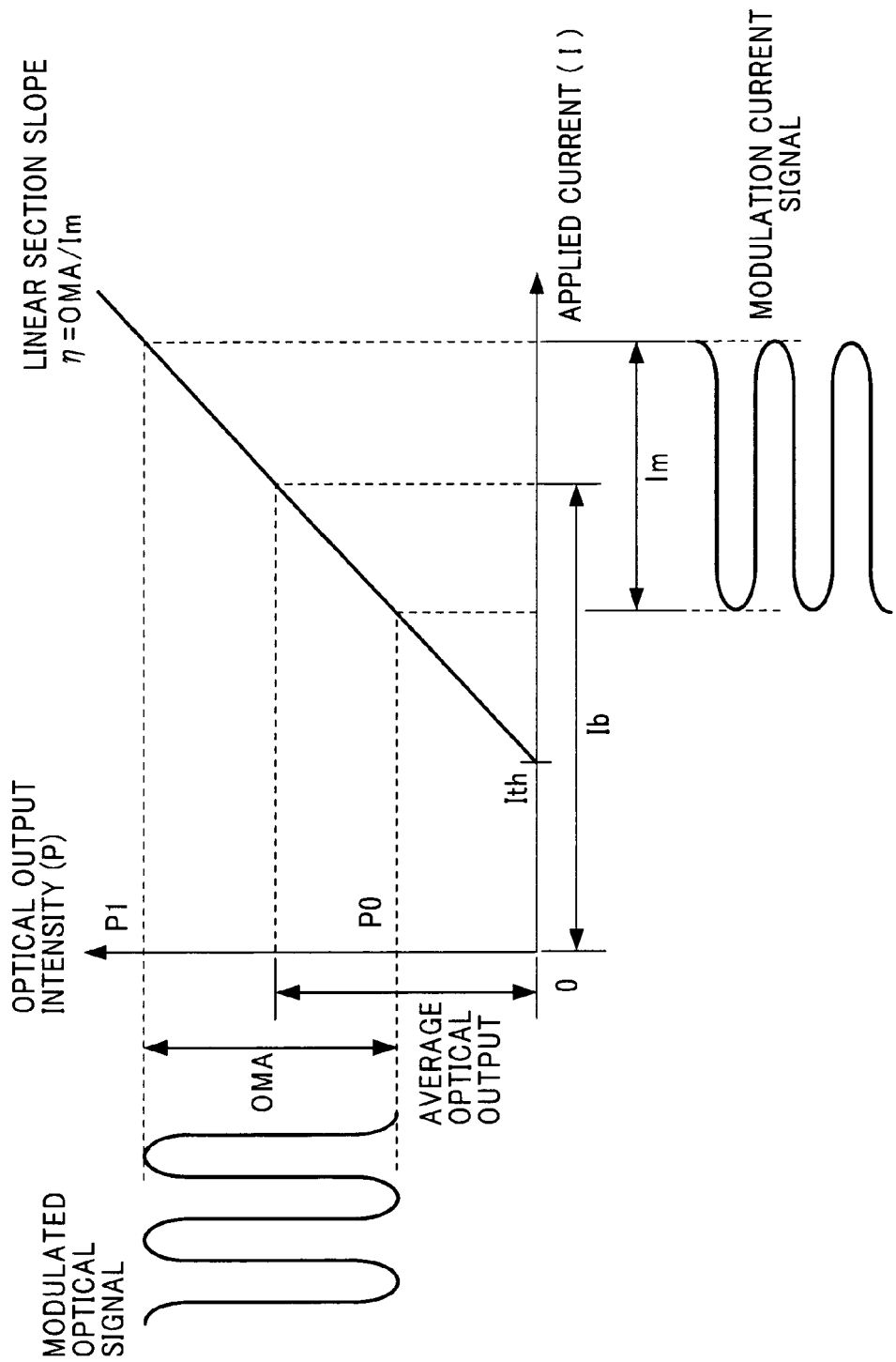
FIG. 1 is a characteristic diagram showing the relationship between the applied current and the optical output intensity of laser diode.
Figure 2:
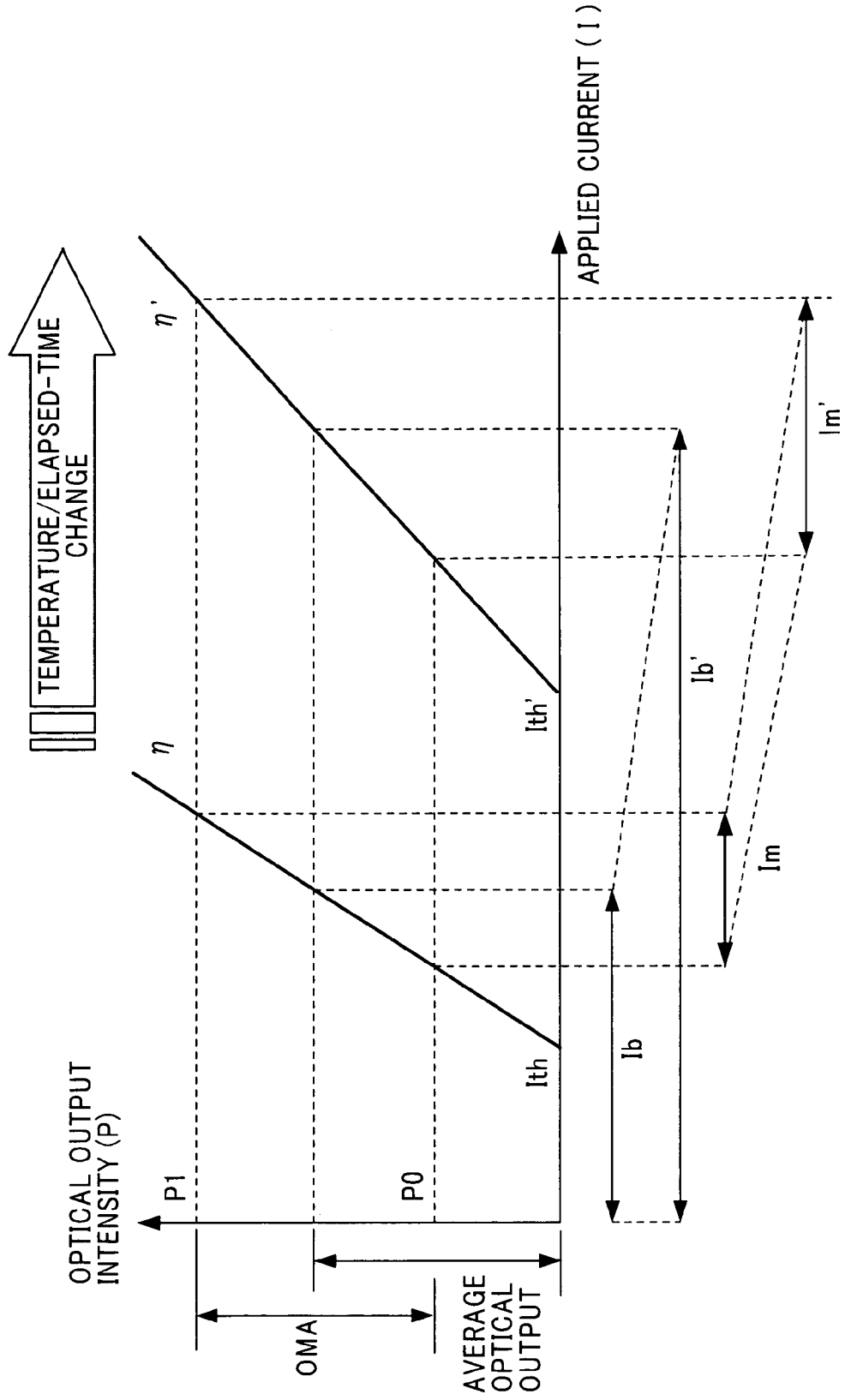
FIG. 2 is a characteristic diagram showing the temperature change and elapsed-time change of laser diode.

The LD 1 is AC-coupled through the capacitor 14 to the modulation circuit 2, and a modulation current from the modulation circuit 2 is applied to the LD 1. The modulation current from the capacitor 14 corresponds to the modulation current Im as shown in FIG. 1, and a modulated optical output is generated from the LD 1 and then inputted to an optical waveguide etc.

Provided that logical "1" and "0" levels in optical output of LD 1 are P1 and P0, respectively, the average value of optical outputs of LD 1 is given ½ the sum of P1 and P0 and the OMA and extinction ratio is given the difference and ratio, respectively, between P1 and P0. Therefore, when the average value of optical outputs and OMA are obtained, the extinction ration can be determined uniquely. Therefore, by controlling the optical output and OMA, the extinction ratio can be controlled.

The modulation circuit 2 is composed of: a pair of transistors 2a, 2b; resistors 2c, 2d connected between the respective collectors and a power source Vs; and input terminals 2e, 2f. The transistors 2a, 2b are switched based on transmission signals S1, S2 inputted to the input terminals 2e, 2f from outside, and thereby the modulation current applied to the LD 1 is output from the collector of transistor 2b.

The optical output measurement circuit 6 is composed of: a capacitor 6a connected in series to the PD 5; and a resistor 6b connected in parallel to the capacitor 6a. The circuit 6 integrates the optical current output of PD 5 to generate an average value from optical outputs of LD 1, and applies that result to the A/D converter 12.

The temperature measurement circuit 7 is composed of: a current source 7a connected to the power source Vs; and a thermistor 7b connected in series to the current source 7a. The thermistor 7b has a resistance value varied depending on atmospheric temperature at its installation site, and generates a terminal voltage, as a temperature detection value, according to the resistance value.

The microprocessor 8 is, for example, composed of CPU. It controls the current sources 3, 4 and the modulation current and bias current, according to the program stored in the nonvolatile memory 9, based on values measured by the optical output measurement circuit 6 and temperature measurement circuit 7.

The operation of the first embodiment will be explained later with that of the second embodiment referring to FIG. 4 since it is the same as that of the second embodiment explained later.

Second Embodiment

Figure 4:
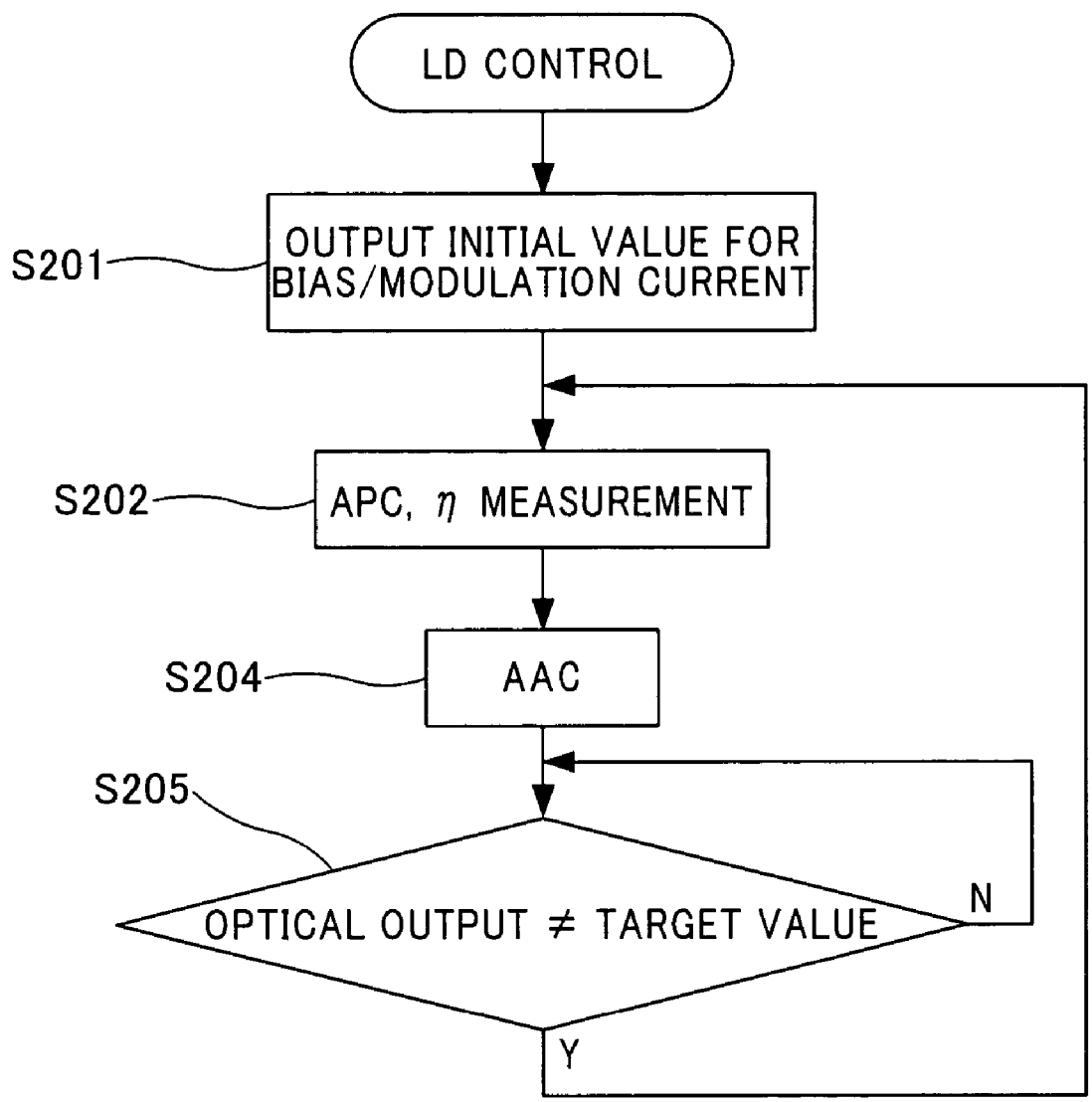
FIG. 4 is a flowchart showing a control method for laser diode in a second preferred embodiment of the invention as well as showing an operation of the first embodiment.

FIG. 4 is a flowchart showing a control method for laser diode in the second preferred embodiment of the invention as well as showing the operation of the optical transmitter in the first embodiment. The method or operation is conducted by the microprocessor 8. In FIG. 4, S means a step.

Figure 5:
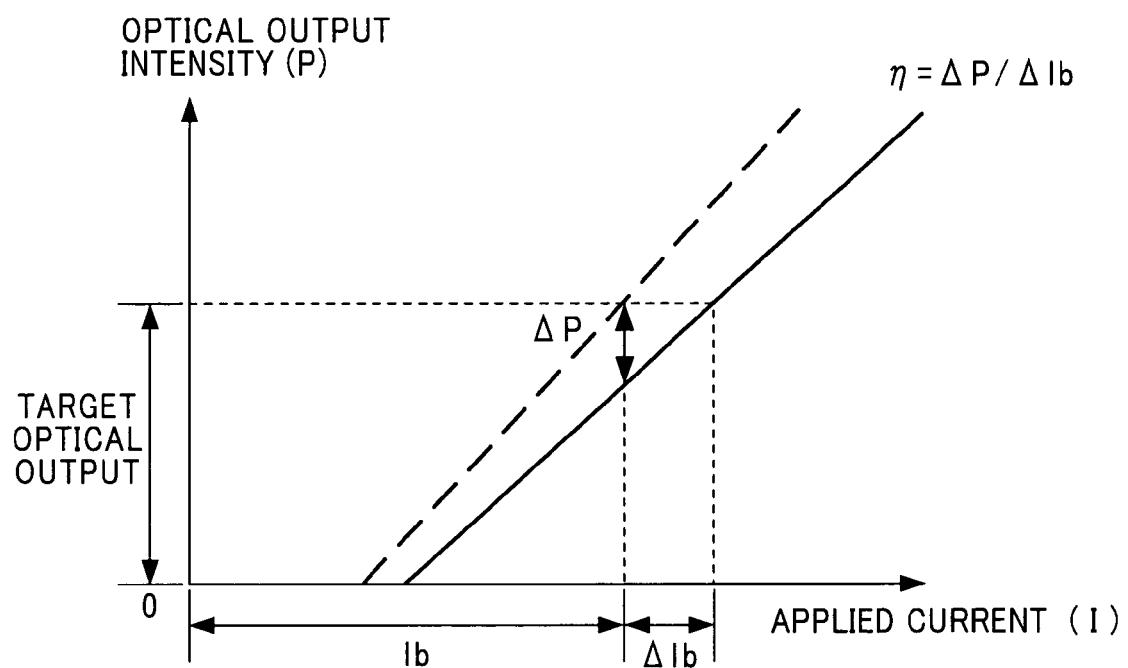
FIG. 5 is a diagram showing a relationship between a variation in optical output and bias current and a variation in slope efficiency.

FIG. 5 is a characteristic diagram showing the relationship between a variation in optical output and bias current and a variation in slope efficiency.

Referring to FIG. 3 to 5, the control method for laser diode and the operation of microprocessor will be explained below.

In the second embodiment, the optical output and OMA (optical modulation amplitude) are automatically controlled according to the temperature change and elapsed-time change of oscillation threshold Ith and slope efficiency $\eta$.

First, the microprocessor 8 outputs the initial values of bias current Ib and modulation current Im to control the current sources 3 and 4 (S201). These initial values are made small as much as possible so as to prevent the breaking of a light receiving element of an opposing optical receiver due to excessive emission intensity of LD 1. For example, they may be about half a current at the minimum temperature in the range of operation temperature of the optical transmitter 100. Although these values vary depending on the individual difference of LD 1, it is not necessary to adjust individually and they can be calculated as the minimum operation condition from the data sheet, design values etc. of LD 1. These initial values are previously written in the nonvolatile memory 9.

On the other hand, the optical output is measured by the optical output measurement circuit 6 (first step), and its measurement value is converted into a digital value by the A/D converter 12 and inputted to the microprocessor 8. The microprocessor 8, based on the initial values and the output of A/D converter 12, feeds back the measurement value and executes the APC (automatic power control) to control the bias current so as to make the average value of optical output to coincide with the target value being previously set (S202, second step). The target value of optical output is previously written into the nonvolatile memory 9.

In the APC execution process, the microprocessor 8 determines the slope efficiency $\eta$ of LD 1 from the optical output intensity P of optical output measurement circuit 6 and the applied current I (S202, second step). In this step, obtained are a variation $\Delta P$ in optical output measurement value and a variation $\Delta Ib$ in bias current in the APC execution process. As shown in FIG. 5, Ith and $\eta$ of LD 1 are changed from the dotted-line characteristic to the solid-line characteristic. If the optical output decreases by $\Delta P$ before conducting the APC, the bias current is increased by $\Delta Ib$ by the APC so as to make the optical output to coincide with the target value. In this case, the ratio of $\Delta P$ and $\Delta Ib$, i.e., $\Delta P/\Delta Ib$ corresponds to the slope efficiency $\eta$. Thus, the $\eta$ can be calculated easily.

Next, the microprocessor 8 conducts AAC (automatic amplitude control) based on the slope efficiency $\eta$ obtained in S202 (S204, third step). The AAC is performed by calculating modulation current Im based on the $\eta$ so as to coincide with the target value being previously set. For example, since the ratio of OMA and Im corresponds to $\eta$, when OMA is constant, Im is inversely proportional to $\eta$. Therefore, the ratio of OMA target value and $\eta$ is Im. The OMA target value is previously written in the nonvolatile memory 9.

Next, the microprocessor 8 checks the measurement value of optical output measured by the optical output measurement circuit 6 (S205). If the measurement value does not coincide with the target value of optical output due to the characteristic change of LD 1 caused by temperature change or elapsed-time change, the procedure is back to S202 and the APC and AAC are repeated until the measurement value coincides with the target value of optical output. Thereby, the LD control can be performed according to temperature change and elapsed-time change. If the optical output is equal to the target value, the result of S204 is retained.

(Method of Determining the Target Values for Optical Output and OMA)

Next, the method of determining the target values for optical output and OMA will be explained. The optical coupling efficiency of the backward output of LD 1 and the PD 5 is generally likely to be dispersed in the assembling. Therefore, the target values for optical output and OMA need to be adjusted individually. However, in the process of assembling, when center alignment is conducted to allow the optical coupling of the forward output of LD 1 with an optical waveguide, the optical current of PD 5 also can be measured at this time. Thus, the ratio of the forward output of LD 1 and the optical current of PD 5 can be known previously. Using this ratio, the target values for optical output and OMA can be calculated.

The optical coupling efficiency of the backward output of LD 1 and the PD 5 is frequently varied due to temperature. The variation of optical coupling efficiency is generally about ±0.5 dB at 25 to 70° C. In order to make a high-precision control, the surrounding temperature is swept in the necessary temperature range using a temperature-controlled bath etc., and temperature characteristic data are measured for the optical coupling efficiency of the backward output of LD 1 and the PD 5. From these data, the target values for optical output and OMA at each temperature are calculated, and tables of the target values are created and stored in the nonvolatile memory 9. Thus, the procedures of S202 and S204 are conducted such that temperature measured by the temperature measurement circuit 7 is read out and target values corresponding that temperature are obtained from the tables.

(Effects of the First and Second Embodiments)

In the first and second embodiments, the bias current is adjusted by APC and the OMA or extinction ratio is adjusted to have a predetermined value by AAC based on a slope efficiency η or its corresponding value. Thereby, the adjustment in manufacturing can be easily conducted, regardless of the individual difference of temperature characteristic in LD 1, in order to prevent deterioration in optical signal characteristic.

Further, since the optical output and OMA are automatically controlled according to the temperature change and elapsed-time change of oscillation threshold Ith and slope efficiency η, it can cope with the elapsed-time change of LD characteristic.

Third Embodiment (Method of Controlling the Laser Diode)

Figure 6:
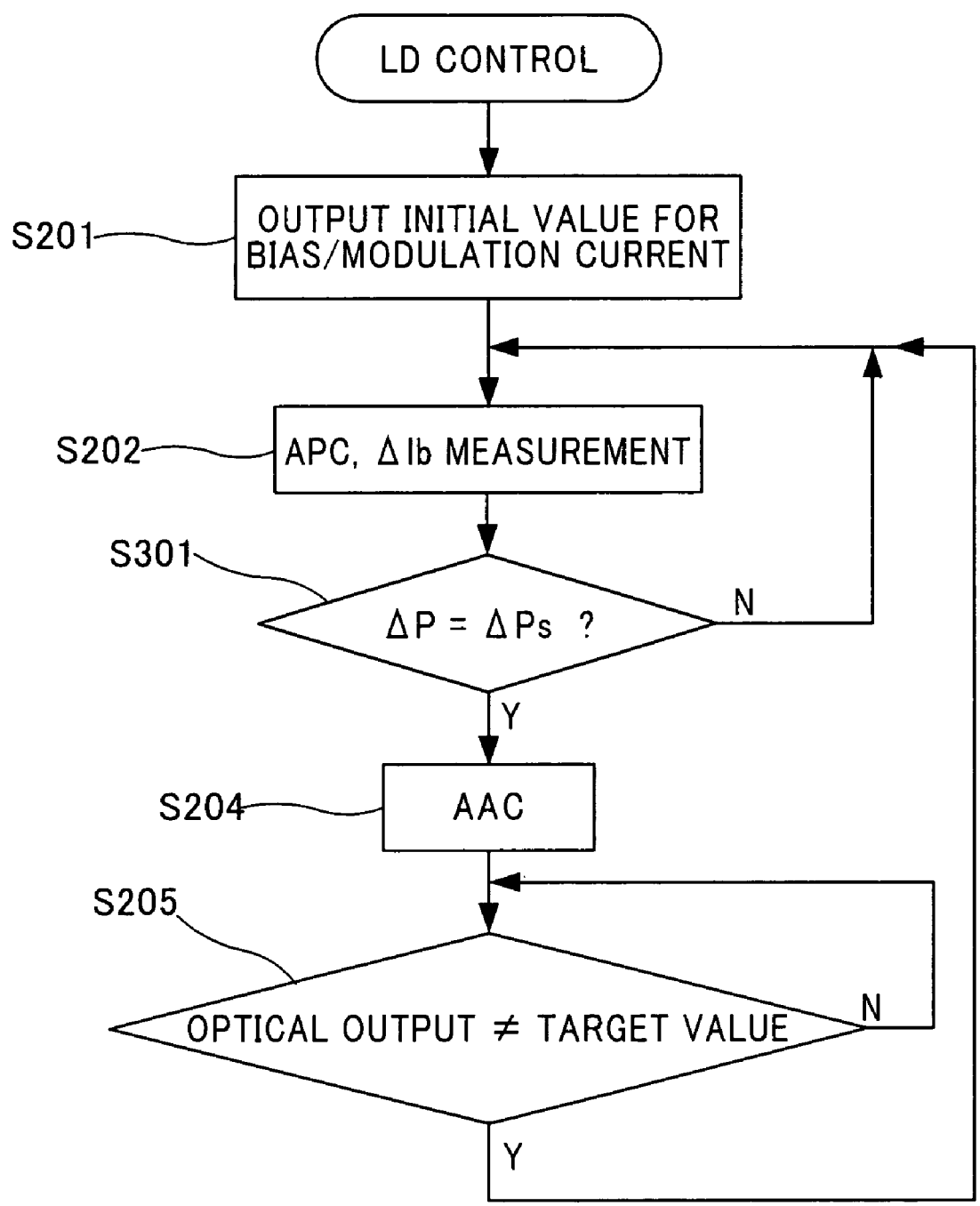
FIG. 6 is a flowchart showing a control method for laser diode in a third preferred embodiment of the invention.

FIG. 6 shows a control method for laser diode in the third preferred embodiment of the invention. In FIG. 6, S means step.

The third embodiment is different from the second embodiment in the procedures of S201 and S202 as described in the second embodiment. The processing shown in FIG. 6 is also conducted by the microprocessor 8 based on the program stored in the nonvolatile memory 9.

The microprocessor 8 conducts the procedures in S201, and then it measures a variation of bias current ΔIb, as a corresponding value of η, varied with the change of optical output (S202). Then, it is judged whether or not ΔP (variation of optical output)=ΔPs (preset value) (S301). If the ΔP measured by the optical output measurement circuit 6 coincides with the predetermined ΔPs, the processing of microprocessor 8 is shifted to S204. In S204, a modulation current Im is outputted in proportional to the measured ΔIb. After that, until the optical output reaches the target value, the above sequences are repeated. The proportionality constant of Im to ΔIb is equal to the ratio of targeted OMA to ΔPs, i.e., OMA/ΔPs=Im/ΔIb, and is previously stored in the nonvolatile memory 9.

Further, the microprocessor 8 continues to monitor the measurement value of optical output measured by the optical output measurement circuit 6 (S205). When the measurement value does not coincide with the target value of optical output due to variation in LD 1 characteristic caused by temperature change or elapsed-time change, the processing is moved back to S202 and the APC and AAC are repeated until the measurement value of optical output coincides with the target value. If [optical output]=[target value], the result of S204 is retained.

(Effects of the Second Embodiment)

In the third embodiment, the same effects can be obtained as in the first and second embodiments. Further, the time required in the processing of microprocessor 8 can be reduced.

Fourth Embodiment (Composition of Control Circuit)

Figure 7:
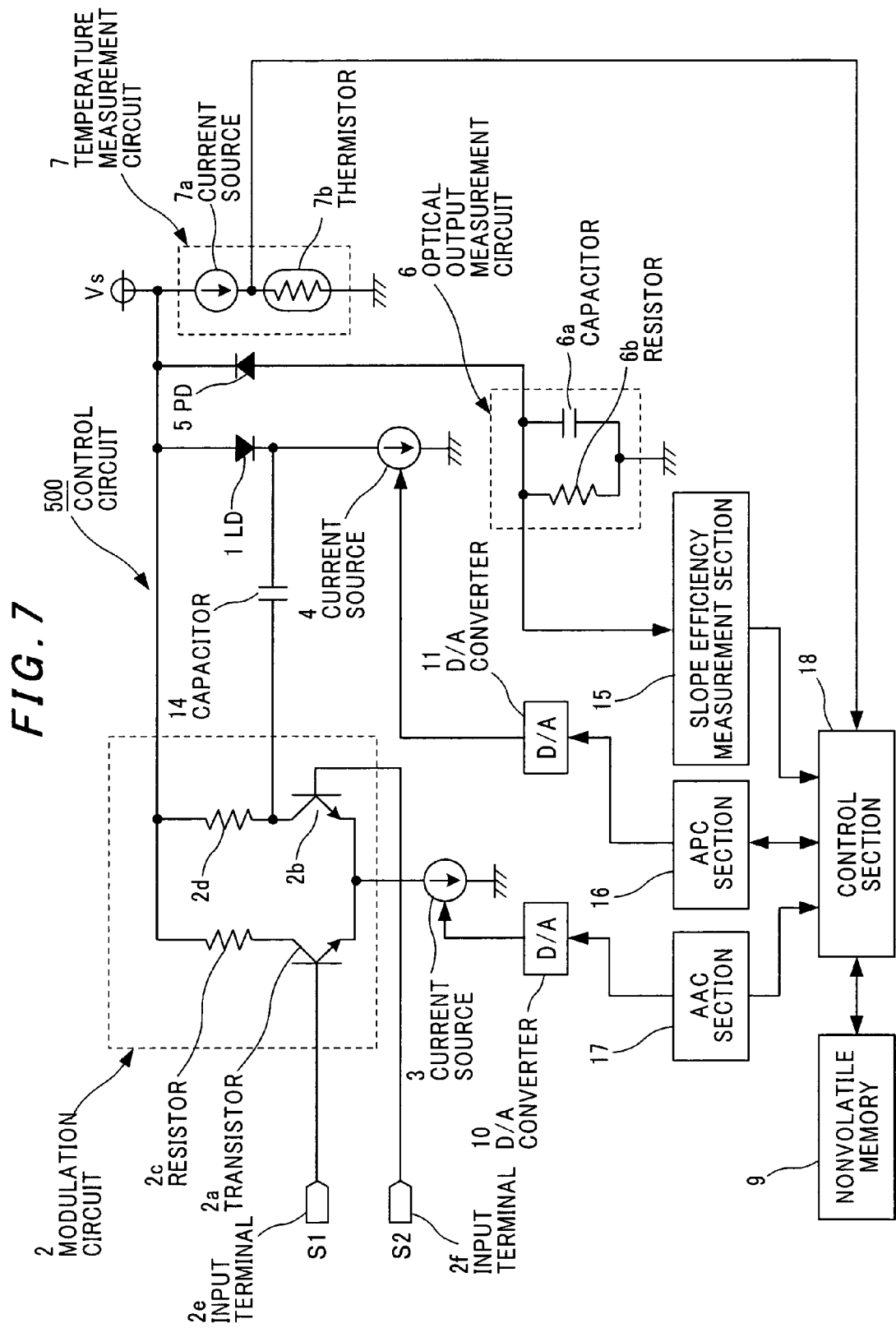
FIG. 7 is a circuit diagram showing a control circuit for laser diode in a fourth preferred embodiment of the invention.

FIG. 7 shows a control circuit for laser diode in the fourth preferred embodiment of the invention. In the fourth embodiment, used in place of the microprocessor 8 of the first embodiment (FIG. 3) are a slope efficiency measurement section 15, an APC (automatic power control) section 16, an AAC (automatic amplitude control) section 17, and a control section 18 that is connected with the sections 15-17, the nonvolatile memory 9 and the temperature measurement circuit 7 to control the entire control circuit. The control circuit 500 of the fourth embodiment is composed of them. The other components are the same as those of the first embodiment as shown in FIG. 3. In FIG. 7, like components are indicated by using the same numerals in FIG. 3 and their explanations are omitted below.

The slope efficiency measurement section 15 measures the slop efficiency or its corresponding value of LD 1 and outputs it to the control section 18. The APC section 16 adjusts the bias current such that optical output measured by the optical output measurement circuit 6 coincides with a predetermined value. The AAC section 17 adjusts, according to the measurement result of the slope efficiency measurement section 15, the modulation current such that the OMA or extinction ratio coincides with a predetermined value. Alternatively, these functions can be assigned to the microprocessor 8 and, in such a case, the composition of control circuit becomes the same as that in FIG. 3.

(Operation of the Fourth Embodiment)

The control operation of the fourth embodiment is as explained with reference to FIGS. 4 and 6.

In using the control as shown in FIG. 4, the APC in S202 is conducted by the APC section 16, and the η measurement in S202 is conducted by the slope efficiency measurement section 15, its measurement result is sent through the control section 18 to the nonvolatile memory 9 and stored therein, when necessary, the measurement result is read out and sent to the AAC section 17. The AAC in S204 is conducted by the AAC section 17. The other control procedures are conducted by the control section 18.

In using the control as shown in FIG. 6, the ΔIb measurement in S202 and the procedure in S301 are conducted by the slope efficiency measurement section 15. The other procedures are the same as those in FIG. 4.

(Effects of the Fourth Embodiment)

In the fourth embodiment, like the first embodiment, the bias current is adjusted by the APC section 16 and the OMA or extinction ratio is adjusted to have a predetermined value by the AAC section 17 based on a slope efficiency $\eta$ or its corresponding value. Thereby, the adjustment in manufacturing can be easily conducted, regardless of the individual difference of temperature characteristic in LD 1, in order to prevent deterioration in optical signal characteristic.

Further, since the optical output and OMA are automatically controlled according to the temperature change and elapsed-time change of oscillation threshold Ith and slope efficiency $\eta$, it can cope with the elapsed-time change of LD characteristic.

[Modifications]

Although in the above embodiments the LD 1 is AC-coupled through the capacitor 14 to the transistor 2b of the modulation circuit 2, it may be AC-coupled to both transistors 2a, 2b in differential drive manner. Alternatively, the LD 1 may be DC-coupled to the modulation circuit 2, instead of the AC-coupling.

Although in the first embodiment the APC and AAC of LD 1 are conducted by using the microprocessor 8, the other means for conducting the APC and AAC may be used. For example, such a means can be composed of a logic circuit, analog computing circuit and various semiconductor devices.

In the second embodiment, when conducting the AAC in S204, if the variation of modulation current Im is so large, the change may be made, for example, in increments of 1/10 of the calculated modulation current Im so as to prevent the increase of chirp.

Although in the above embodiments the control is conducted to make the optical output and OMA (optical modulation amplitude) constant, it may be conducted such that the target value of optical output or OMA is changed according to a certain situation. For example, the target value may be changed according to a temperature or transmission speed of signal, or a situation that the temperature, bias current or modulation current exceeds a predetermined threshold, or a situation that no signal is inputted.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A control method for a laser diode, wherein optical output and OMA (optical modulation amplitude) or extinction ratio of the laser diode are controlled while modulating the optical output of the laser diode by applying a bias current and a modulation current to the laser diode, comprising:
    a first step of measuring the optical output of the laser diode, the optical output being integrated to generate an average value from optical outputs of the laser diode;
    a second step of measuring a slope efficiency or a corresponding value of the slope efficiency by a ratio of a variation of the optical output and a variation of the bias current in optical output measurement value while conducting APC (automatic power control) to adjust the bias current such that the optical output coincides with a predetermined value; and
    a third step of adjusting the modulation current by AAC (automatic amplitude control) according to the modulation current calculated with the slope efficiency or the corresponding value of the slope efficiency such that the OMA or extinction ratio coincides with a predetermined value,
    wherein monitoring of the optical output measured in the first step is continued after the third step to be fed back, and
    wherein the second step and the third step are repeated when the optical output does not coincide with the predetermined value, until the optical output coincides with the predetermined value.

2. The control method according to claim 1, wherein:
    the first step is conducted such that the optical output of the laser diode is measured by a light receiving element; and
    the third step is conducted such that the predetermined value of the optical output and the predetermined value of the OMA are changed based on an optical current of the light receiving element and a detection value of atmospheric temperature at an installation site of the laser diode.

3. The control method according to claim 1, wherein:
    the third step is conducted such that the AAC is conducted to output a modulation current inversely proportional to the slope efficiency or the corresponding value of the slope efficiency.

4. The control method according to claim 1, wherein:
    the third step is conducted such that, when a variation of the optical output in conducting the APC reaches a predetermined value, the corresponding value of the slope efficiency is made to be the variation of the bias current and the AAC is conducted to output the modulation current proportional to the corresponding value of the slope efficiency.

5. A control circuit for a laser diode, wherein output of the laser diode is modulated by applying a bias current and a modulation current to the laser diode, comprising:
    an APC (automatic power control) section that adjusts the bias current such that an optical output of the laser diode measured by a light receiving element coincides with a predetermined value;
    a slope efficiency measurement section that measures a slope efficiency of the laser diode or a corresponding value of the slope efficiency by a ration of a variation of the optical output and a variation of the bias current in optical output measurement value, the optical output being integrated to generate an average value from optical outputs of the laser diode; and
    an AAC (automatic amplitude control) section that adjusts, according to a measurement result of the slope efficiency measurement section, the modulation current such that OMA or extinction ratio of the laser diode coincides with a predetermined value,
    wherein the optical output measured by the light receiving element is monitored and fed back, and
    wherein the processing by the APC and the AAC are repeated when the optical output does not coincide with the predetermined value until the optical output coincides with the predetermined value.

6. The control circuit according to claim 5, wherein:
    the AAC section outputs a modulation current inversely proportional to the slope efficiency or the corresponding value of the slope efficiency measured by the slope efficiency measurement section.

7. The control circuit according to claim 5, wherein:
    the slope efficiency measurement section measures, when a variation of the optical output in conducting the APC reaches a predetermined value, the variation of the bias current as the corresponding value of the slope efficiency, and the AAC section outputs the modulation current proportional to the corresponding value of the slope efficiency.

8. The control circuit according to claim 5, wherein:
the AAC section changes the predetermined value of the optical output and the predetermined value of the OMA, based on an optical current of a light receiving element, which measures the optical output of the laser diode, and a detection value of atmospheric temperature at an installation site of the laser diode.

9. The control circuit according to claim 6, wherein:
the AAC section changes the predetermined value of the optical output and the predetermined value of the OMA, based on an optical current of a light receiving element, which measures the optical output of the laser diode, and a detection value of atmospheric temperature at an installation site of the laser diode.

10. The control circuit according to claim 7, wherein:
the AAC section changes the predetermined value of the optical output and the predetermined value of the OMA, based on an optical current of a light receiving element, which measures the optical output of the laser diode, and a detection value of atmospheric temperature at an installation site of the laser diode.

11. An optical transmitter, comprising:
a laser diode;
a current source that applies a bias current to the laser diode;
a modulation circuit that applies a modulation current to the laser diode to modulate an output of the laser diode;
an optical output measurement circuit that measures an optical output of the laser diode, the optical output being integrated to generate an average value from optical outputs of the laser diode; and
a control section that conducts APC (automatic power control) to adjust the bias current such that the optical output coincides with a predetermined value, and AAC (automatic amplitude control) to adjust the modulation current, according to a slope efficiency or a corresponding value of the slope efficiency obtained in measurement such that OMA or extinction ratio coincides with a predetermined value,
wherein the optical output measured by the optical output measurement circuit is monitored and fed back, and
wherein the processing by the APC and the AAC are repeated when the optical output does not coincide with the predetermined value until the optical output coincides with the predetermined value.

12. The optical transmitter according to claim 11, wherein:
the control section conducts the AAC to output a modulation current inversely proportional to the slope efficiency or the corresponding value of the slope efficiency.

13. The optical transmitter according to claim 11, wherein:
the control section measures, when the variation of the optical output in conducting the APC reaches a predetermined value, the variation of the bias current as the corresponding value of the slope efficiency, and conducts the AAC to output the modulation current proportional to the corresponding value of the slope efficiency.

14. The optical transmitter according to claim 11, further comprising:
a light receiving element that measures an optical output of the laser diode,
wherein the control section changes the predetermined value of the optical output and the predetermined value of the OMA, based on an optical current of the light receiving element and a detection value of atmospheric temperature at an installation site of the laser diode.

15. The optical transmitter according to claim 12, further comprising:
a light receiving element that measures an optical output of the laser diode, wherein the control section changes the predetermined value of the optical output and the predetermined value of the OMA, based on an optical current of the light receiving element and a detection value of atmospheric temperature at an installation site of the laser diode.

16. The control method according to claim 1, wherein:
the first step is conducted such that the optical output of the laser diode is measured by a light receiving element and integrated by an optical output measurement circuit comprising a capacitor connected in series to the light receiving element and a resistor connected in parallel to the capacitor.

17. The control circuit according to claim 6, wherein:
the optical output is integrated by an optical output measurement circuit comprising a capacitor connected in series to the light receiving element and a resistor connected in parallel to the capacitor.

18. The optical transmitter according to claim 14, further comprising:
a light receiving clement that measures an optical output of the laser diode,
wherein said optical output measurement circuit comprises a capacitor connected in series to said light receiving element and a resistor connected in parallel to the capacitor.

* * * * *